(12) United States Patent
Ishikawa et al.

(10) Patent No.: US 6,290,824 B1
(45) Date of Patent: Sep. 18, 2001

(54) MAGNETIC FILM FORMING SYSTEM

(75) Inventors: Yasushi Ishikawa, Katsuta; Fumiomi Ueda, Hiratsuka; Hiroo Ohkawa, Hitachi; Keiji Arimatsu, Hitachi; Takashi Hagiya, Hitachi; Hirosuke Yamaguchi, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/141,728

(22) Filed: Oct. 27, 1993

(30) Foreign Application Priority Data

Oct. 28, 1992 (JP) ................................................. 4-290516
Jan. 7, 1993 (JP) ................................................. 5-001285

(51) Int. Cl.⁷ .......................... C23C 14/34; C23C 16/00
(52) U.S. Cl. ................. 204/298.16; 204/298.15; 204/298.23; 204/298.25; 118/719; 414/217; 414/222.01; 414/222.07
(58) Field of Search ........................ 204/298.15, 298.16, 204/298.19, 298.23, 298.25, 298.26, 298.27; 118/719; 414/217, 222, 225, 416

(56) References Cited

U.S. PATENT DOCUMENTS 4,735,701 * 4/1988 Allen et al. ...................... 204/298.15
4,825,808 * 5/1989 Takahashi et al. ............... 204/298.25
4,865,709 * 9/1989 Nakagawa et al. .............. 204/298.16
4,911,815 * 3/1990 Kamei et al. .................... 204/298.25

FOREIGN PATENT DOCUMENTS 57-78123 * 5/1982 (JP) .
61-288067 * 12/1986 (JP) ................................ 204/298.28
63-28863 * 2/1988 (JP) .

* cited by examiner

Primary Examiner—Rodney G. McDonald
(74) Attorney, Agent, or Firm—Mattingly, Stanger & Malur, P.C.

(57) ABSTRACT

A magnetic film forming system which can always apply a magnetic field to a substrate in a constant direction. The magnetic film forming system comprises a vacuum container, a substrate pallet for holding a substrate in the vacuum container and being removable with the substrate held, from the vacuum container, and means for supporting the substrate pallet. Magnetic field generation means are fixed to the substrate pallet for applying a magnetic field to the substrate. When the substrate pallet is removed from the vacuum container, the magnetic field generation means are also taken out together with the substrate.

15 Claims, 13 Drawing Sheets

MAGNETIC FILM FORMING SYSTEM

BACKGROUND OF THE INVENTION

1. Field of the Invention

This invention relates to a system for forming a magnetic film in a magnetic field and more particularly to a magnetic film forming system having a plurality of process chambers, and transport mechanisms for transporting substrates from one process chamber to another.

2. Description of the Related Art

A conventional inline film forming system is described with reference to FIG. 9. The inline film forming system in FIG. 9 comprises a substrate inlet chamber 2, three process chambers 1a, 1b, and 1c, and a substrate outlet chamber 3 which are linked in order. Sluice valves 8a, 8b, 8c, and 8d are disposed between each of the chambers. Each of the process chambers 1a, 1b, and 1c is provided with a device (not shown) for performing one process such as heating a substrate before film forming, sputtering film forming, ion beam sputtering film forming, or film forming by evaporation. A transport line 5 for transporting a substrate 101 is extended through the substrate inlet chamber 2, process chambers 1a, 1b, and 1c, and substrate outlet chamber 3.

The sequence for forming a film by using the system will be described. First, a substrate 101 on which a film is to be formed is fed into the inlet chamber 2, which is then evacuated by evacuation installation 9a. The process chambers 1a, 1b, and 1c, and the outlet chamber 3 are evacuated by evacuation installations 9b, 9b, 9d, and 9e respectively. After the inlet chamber 2 is evacuated, the separation valve 8a is opened and the transport line 5 is operated to transport the substrate 101 to the process chamber 1a, which has been already evacuated. In the process chamber 1a, predetermined steps such as heating the substrate before film formation and film formation are performed by the processing device installed in the chamber. After the predetermined steps are performed, the separation valve 8b is opened and the substrate 101 is transported to the following process chamber 1b over the transport line 5. Upon completion of processing the substrate 101 in the process chamber 1b, the substrate 101 is transported to the process chamber 1c for further processing. After predetermined processing in the process chamber 1c is complete, the substrate 101 is transported to the outlet chamber 3 from which it is removed. A large number of substrates 101 can be fed in sequence into the substrate inlet chamber 2 and through the process chambers 1a, 1b, and 1c one after another for processing.

In order, to form a film whose magnetic orientation is aligned, a film forming method in a magnetic field is used by which a film is formed while magnetic orientation of film particles is being aligned by applying a magnetic field. An example of the film forming system in the related art is given in "Journal of Vacuum Science & Technology A (Composition distribution and magnetic characteristics of sputtered Permalloy films with substrate angle)" second series volume 7, number 3, May/June 1989. This article describes a technique in which a permanent magnet is attached to a substrate holder which is fixed to a film forming system and a substrate is mounted on the substrate holder.

To form a magnetic film in a magnetic field by a conventional inline film forming system, magnetic field generation means is fixed outside or inside a process chamber and a magnetic field is applied to a space within the process chamber where a substrate is placed.

An example of a conventional inline system in which magnetic field generation means is attached outside a sputter film forming process chamber will be described with reference to FIG. 7. As shown here, Helmholtz magnetic coils 4a, 4b, 4c, and 4d are disposed outside a process chamber 1d which is provided with a magnetic target 3 and an RF power supply 2 for applying voltage to the magnetic target 3. The Helmholtz magnetic coils 4a, 4b, 4c, and 4d form a magnetic field 6 in a space where a substrate 101 is placed. The substrate 101 is supported by a transport line (not shown). Magnetic sputter particles sputtered from the magnetic target 3 are affected by the magnetic field 6 to form a film magnetically oriented on the substrate 101.

An example of a conventional inline system in which magnetic field generation means is attached inside a sputter film forming process chamber will be described with reference to FIG. 8. As shown here, permanent magnets 4e and 4f are disposed at places around a substrate 101 carried in a process chamber 1e. The permanent magnets 4e and 4f are supported by magnetic support means 7 fixed to the process chamber 1e. Since the permanent magnets 4e and 4f form a magnetic field 6 in a space where the substrate 101 is supported by a transport line (not shown), sputter particles sputtered from the magnetic target 3 are affected by the magnetic field 6 to form a film magnetically oriented on the substrate 101.

However, a conventional film forming system having such magnetic field generation means suffers from the problem that when a substrate is taken out from the film forming system after a film has been formed, it is placed out of the magnetic field of the magnetic field generation means. Thus, if the substrate is taken out from the film forming system in the state in which it is not completely cooled after the film has been formed, the magnetic orientation of the film is not aligned, there by degrading the magnetic characteristic. To prevent this inconvenience, the substrate must be left in the film forming system until it is completely cooled after film formation. It takes time until the substrate is completely cooled, substantially lowering the throughput of the system.

Forming a magnetic multilayer film by using the conventional inline system having such magnetic field generation means, suffers from the following problems:

(1) To form a multilayer film, a number of film forming process chambers which differ in film forming source must each be provided with magnetic field generation means. At the time, it is very difficult to completely match the various directions of magnetic fields applied to substrates by the magnetic field generation means in the process chambers. This causes the orientation of the magnetic film to vary from one layer to another, degrading the magnetic characteristic of the magnetic film. There are two main reasons why the directions of the magnetic fields in the process chambers cannot be matched are as follows. First, to completely match the directions of the magnetic fields generated by the magnetic field generation means in the film forming process chambers, the directions of coils and magnets must be matched completely. However, it is technically very difficult to completely match the directions of coils and magnets which are separated from each other and adjustment of the directions requires that the system be stopped over a long period of time. Second, when a substrate is transported, the substrate turns and its direction will vary.

(2) When the magnetic field generation means is installed outside each film forming process chamber, a magnetic field must be generated within the process chamber, thus a large magnetic field generation means needs to be installed, there by increasing costs.

(3) Process chambers must be located apart from each other to prevent magnetic fields generated by magnetic field generation means in the contiguous process chambers from affecting each other to become uneven magnetic fields. Thus, the line in the system is longer as compared with a normal inline system having no magnetic field generation means, leading to inconvenient installation of the former system.

(4) When a substrate is transported to the contiguous film forming process chamber after film formation, it is temporarily placed out of the magnetic field. Thus, if it is transported to the next process chamber in the state in which the substrate is not completely cooled after film formation, it is cooled out of the magnetic field, and so thus the magnetic orientation of the film is not aligned, this degrading the magnetic characteristic of the magnetic material. To prevent this inconvenience, the substrate must be left in the process chamber until it is completely cooled after film formation. It takes time to cool the substrate, which substantially lowers the throughput of the line.

SUMMARY OF THE INVENTION

Accordingly, it is an object of the invention to provide a film forming system which can form a magnetic film having a high magnetic characteristic by always applying a magnetic field in a constant direction to a substrate in the system.

To this end, according to a first embodiment of the invention, there is provided a magnetic film forming system comprising a vacuum container, a substrate pallet for holding a substrate in the vacuum container and being removable, with the substrate held, from the vacuum container, means for supporting the substrate pallet in the vacuum container, means for forming a film on the substrate, and magnetic field generation means for applying a magnetic field to the substrate. The magnetic field generation means is fixed to the substrate pallet. When the substrate pallet is removed from the vacuum container, the magnetic field generation means is taken out from the vacuum container together with the substrate pallet.

According to a second embodiment of the invention, there is provided a magnetic film forming system comprising a vacuum container, a substrate pallet for holding a substrate, transport means for supporting the substrate pallet in the vacuum container and transporting the substrate pallet, means for forming a film on the substrate, and magnetic field generation means for applying a magnetic field to the substrate. The magnetic field generation means is fixed to the substrate pallet. When the substrate pallet is transported by the transport means, the magnetic field generation means is transported together with the substrate pallet in the vacuum container.

In the magnetic film forming system according to the first embodiment of the invention, a substrate on which a film is formed is retained on the substrate pallet and the substrate together with the substrate pallet can be transported in the vacuum container and taken out therefrom. When a film is formed, the substrate together with the substrate pallet is supported by the support means in the vacuum container. The film forming means forms a film on the substrate on the substrate pallet supported by the support means. The magnetic film generation means applies a magnetic field to the substrate and orients the magnetization direction of a film when it is formed.

In the invention, the magnetic field generation means, which is fixed to the substrate pallet, always applies a magnetic field to the substrate in a constant direction unless the substrate slips off the substrate pallet. Therefore, a magnetic field is always applied to the substrate in a constant direction not only when a film is formed, but also while the substrate pallet is moved in the vacuum container or taken out therefrom. So long as the substrate is held on the substrate pallet, a magnetic field is applied regardless of where the substrate is placed in the vacuum container or whether it is placed inside or outside the vacuum container. Thus, even if the substrate is moved before a film is cooled, film orientation does not vary. Further, since the magnetic field generation means is mounted on the same substrate pallet as the substrate, a magnetic field can be applied at close range. Small magnetic field generation means having a small magnetic field strength can apply a magnetic field efficiently, implementing a small system. Since the magnetic field generation means is taken out from the system together with the substrate pallet, the magnetic field direction can also be adjusted easily.

The magnetic film forming system according to the second embodiment of the invention is provided with means for transporting the substrate pallet in the vacuum container. The vacuum container can also be divided into a number of process chambers. In such an inline film forming system, while a substrate is transported from one chamber to another, a magnetic field is always applied to the substrate in a constant direction by the magnetic field generation means on the substrate pallet, thus there is no risk of the magnetic field application direction varying slightly between each process chamber. Further, since the magnetic field generation means is mounted on the same substrate pallet as the substrate, a magnetic field can be efficiently applied at close range by small magnetic generation means, implementing a small inline film forming system. Since the magnetic field generation means is taken out from the system together with the substrate pallet, the magnetic field direction can also be adjusted easily even if the inline magnetic film forming system comprises a plurality of process chambers.

DESCRIPTION OF THE PREFERRED EMBODIMENTS

Referring now to the accompanying drawings, there are shown inline film forming systems according to embodiments of the invention.

Figure 3:
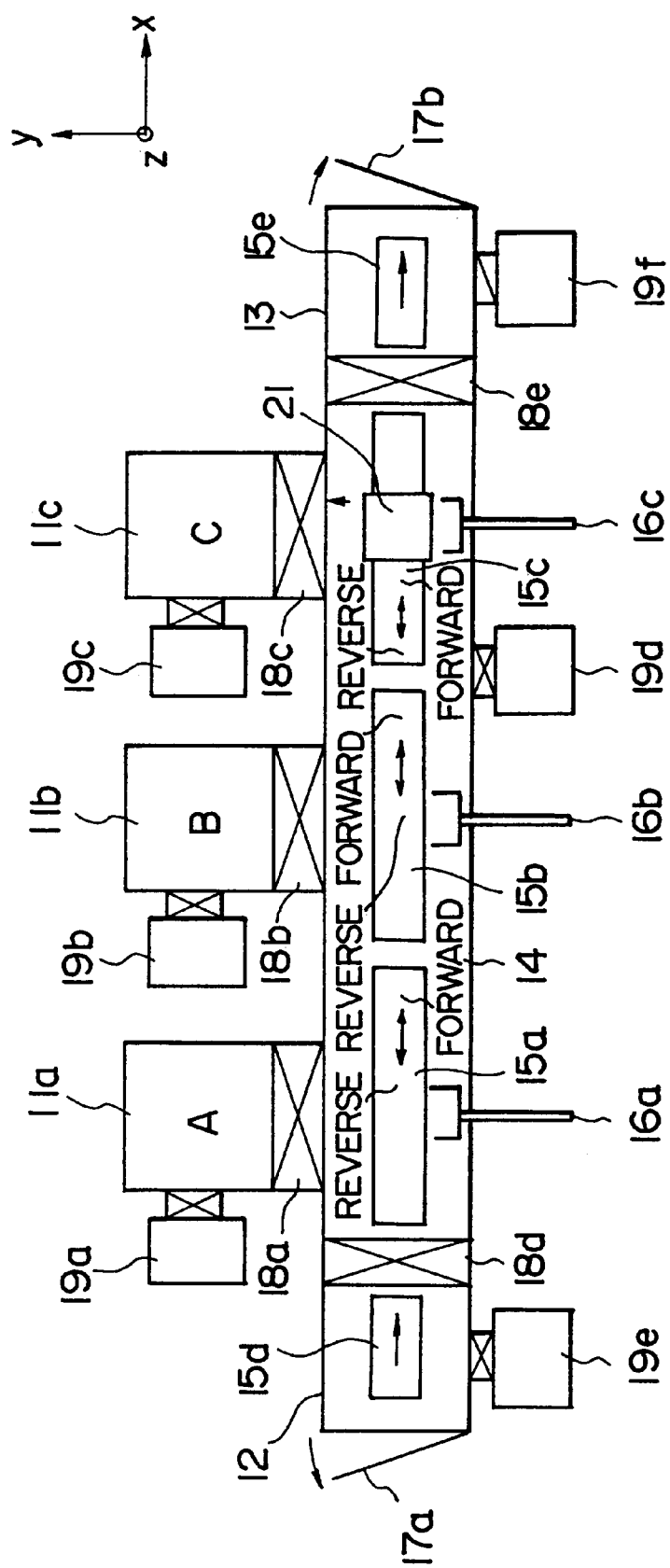
FIG. 3 is a block diagram showing the overall arrangement of the inline film forming system in FIG. 1.

The configuration of an inline film forming system according to one embodiment of the invention will be described with reference to FIG. 3. The inline film forming system according to this embodiment of the invention comprises three film forming process chambers 11a, 11b, and 11c, and a transport chamber 14. A substrate inlet chamber 12 and a substrate outlet chamber 13 are disposed on both ends of the transport chamber 14.

The transport chamber 14 contains y direction transport mechanisms 11a, 11b, and 11c for getting a substrate pallet 21 in and out of the film forming process chambers 11a, 11b, and 11c respectively, and x direction transport mechanisms 15a, 15b, and 15c for moving the substrate 21 in the x direction. The inlet chamber 12 is provided with a door 17a for taking in a substrate pallet 21 from the exterior of the transport chamber 14 and an inlet chamber transport mechanism 15d for passing the taken-in substrate pallet 21 to the x direction transport mechanism 15a in the transport chamber 14. The outlet chamber 13 is provided with an outlet chamber transport mechanism 15e for receiving the substrate pallet 21 having been processed from the x direction transport mechanism 15c in the transport chamber 14 and a door 17b through which the substrate pallet 21 is taken to the exterior of the transport chamber 14.

Separation valves 18a, 18b, and 18c are disposed between the process chambers 11a, 11b, and 11c and the transport chamber 14 respectively for separating the chambers in such a manner that they can be opened and closed. A separation valve 18d is located between the inlet chamber 12 and the transport chamber 14 and a separation valve 18e is located between the outlet chamber 13 and the transport chamber 14. Evacuation installations 19a, 19b, and 19c are connected to the process chambers 11a, 11b, and 11c respectively. An evacuation installation 19d is connected to the transport chamber 14. Evacuation installations 19e and 19f are connected to the inlet chamber 12 and the outlet chamber 13 respectively.

Figure 2A:
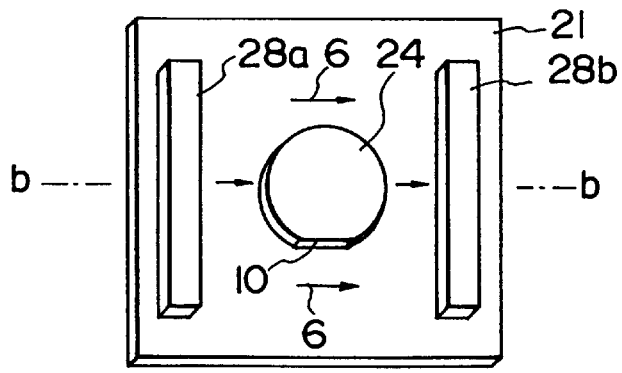
FIG. 2(A) is a perspective view of a substrate pallet in the inline film forming system in FIG. 1.
Figure 2B:
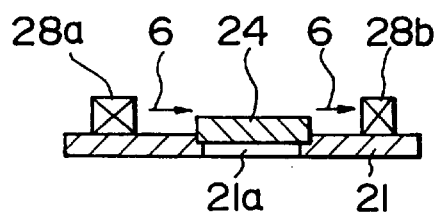
FIG. 2(B) is a sectional view taken on line b—b of FIG. 2(A)

Next, the structure of the substrate pallet 21 will be described with reference to FIGS. 2(A) and 2(B). As shown in FIG. 2(B), the substrate pallet 21 is a plate-like pallet where a through hole 21a is formed at the center. The side of the through hole 21a is stepped to hold a substrate 24. An orientation flat is formed on the sides of the substrate 24 and the through hole 21a to prevent the substrate 24 from turning, as shown in FIG. 2(A). On the substrate pallet 21, two permanent bar magnets 28a and 28b are disposed parallel and facing each other, with the through hole 21a between them. The permanent magnets 28a and 28b apply a magnetic field to the substrate 24 in the direction parallel to the orientation flat 10.

Figure 1:
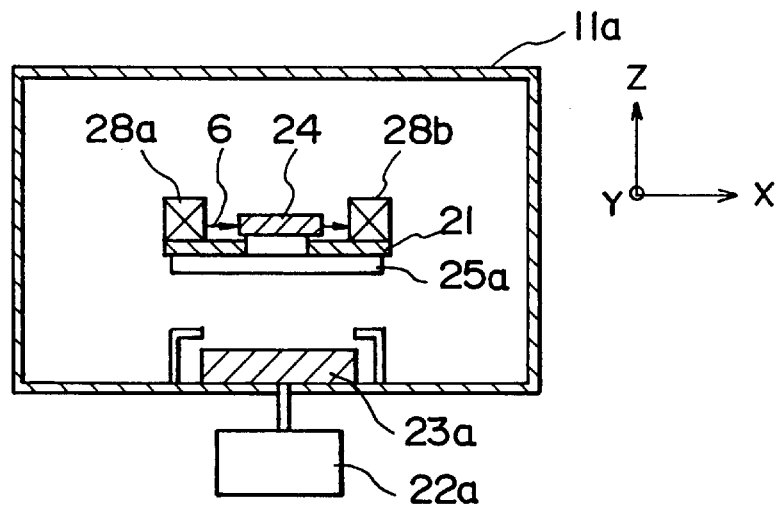
FIG. 1 is a sectional view of a process chamber of an inline film forming system according to one embodiment of the invention.

Next, the internal structure of the process chamber 11a, 11b, 11c will now be described with reference to FIG. 1. The process chamber 11a will be provided with a pallet support mechanism 25a for supporting the substrate pallet 21, a target 23a for sputter film forming on the substrate 24, and an RF power supply 22a for applying a voltage to the target 23a. Although only the process chamber 11a is shown in FIG. 1, each of the process chambers 11b and 11c has the same arrangement as the process chamber 11a. The process chamber 11b (not shown) is provided with a pallet support mechanism 25b, a target, and an RF power supply in the same arrangement as the process chamber 11a. The process chamber 1c (not shown) is provided with a pallet support mechanism 25c, a target, and an RF power supply in the same arrangement as the process chamber 11a. Each of the pallet support mechanisms 25a, 25b, and 25c is provided with a drive mechanism (not shown) for driving the substrate pallet 21 in the z direction.

Figure 4A:
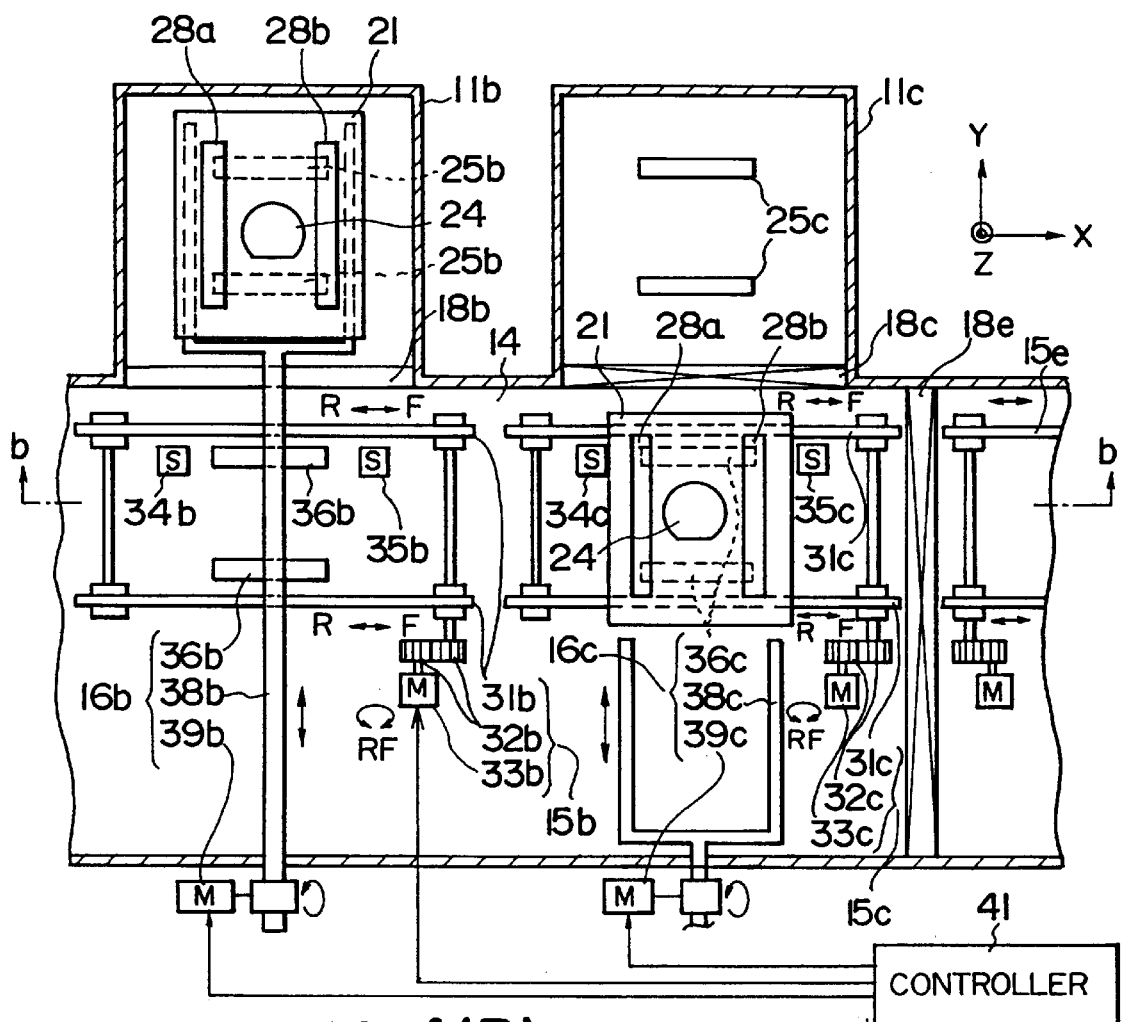
FIGS. 4(A) and 4(B) are partial sectional views showing the configuration of conveyance means of the inline film forming system in FIG. 1.
Figure 4B:
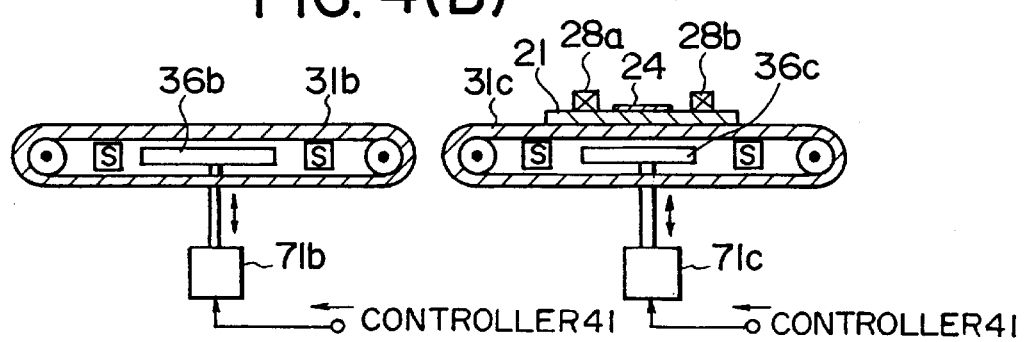

Next, the configuration and operation of the x direction transport mechanisms 15a, 15b, and 15c and the y direction transport mechanisms 16a, 16b, and 16c will be described with reference to FIGS. 4A and 4B. The x direction transport mechanism 15a and y direction transport mechanism 16a are not shown in FIG. 4, but the former has a similar structure to those of other x direction transport mechanisms and the latter has a similar structure to those of other y direction transport mechanisms. The x direction transport mechanism 15b has caterpillars 31b, as shown in FIG. 4(A). A motor 33b is connected via a gear 32b to one axle of the caterpillars 31b for driving the caterpillars 31b. The motor 33b drives the caterpillars 31b as commanded by a controller 41.

A pair of sensors 34b and 35b are disposed inside the caterpillars 31b. The sensors 34b and 35b are adapted to emit light to an object and detect reflected light from the object for detecting the presence of the object. They are spaced at a distance equal to the width of the substrate pallet 21. Output signals of the sensors 34b and 35b are input to the controller 41, which determines where the substrate pallet 21 is positioned on the x direction transport mechanism 15b from the output signals of the sensors 34b and 35b for driving the motor 33b, and then stops the substrate pallet 21 at the front of the y direction transport mechanism 16b. Likewise, the x direction transport mechanism 15c also comprises caterpillars 31c, a gear 32c, a motor 33c, and sensors 34c and 35c.

To move the substrate pallet 21 on the caterpillars 31b onto the caterpillars 31c, the controller 41 rotates the motors 33b and 33c in the forward direction. To move the substrate pallet 21 on the caterpillars 31c onto the caterpillars 31b, the controller 41 rotates the motors 33b and 33c in the reverse direction. The motors 33b and 33c can be rotated in different directions independently of the motor of the x direction transport mechanism 15a (not shown). Therefore, while the x direction transport mechanism 15a is driven in the forward direction to take in a substrate pallet 21 from the inlet chamber 12, the x direction transport mechanisms 15b and 15c can be driven in the reverse direction, for example, to move another substrate pallet 21 from the x direction transport mechanism 15c onto the x direction transport mechanism 15b.

The y direction transport mechanism 16b comprises lift mechanisms 36b disposed inside the caterpillars 31b, a fork member 38b for moving a substrate pallet placed thereon, and a driving motor 39b for driving the fork member 38b in the y direction via a gear. The y direction transport mechanism 16c comprises lift mechanisms 36c, a fork member 38c, and a driving motor 39c. Drive mechanisms 71b and 71c are connected to the lift mechanisms 36b and 36c for driving them in the z direction.

Here, the operation of transporting a substrate pallet 21 from the transport chamber 14 to the process chamber 11b will be described. The lift mechanisms 36b lift up the pallet 21 placed on the caterpillars 31b in the z direction (up and down) to float it from the caterpillars. The fork member 38b is inserted between the substrate pallet 21 lifted up by the lift mechanisms 36b and the caterpillars 38b. When the lift mechanisms 36b are made to descend in this state, the substrate pallet 21 is placed on the fork member 38b.

Next, the driving motor 39b is driven to move the fork member 38b on which the substrate pallet 21 is placed to the process chamber 11b. The pallet support mechanism 25b in the process chamber 11b is made to rise when the substrate pallet 21 is carried in the process chamber 11b. The pallet support mechanism 25b supports the substrate pallet 21 and receives it from the fork member 38b. Again, the driving motor 39b is driven to return the fork member 38b to the transport chamber 14. The pallet support mechanism 25b is moved up and down to the predetermined height appropriate for forming a film and is made to support the substrate pallet 21 at the position until the film forming is complete. After the film forming is complete, by reversing the operation sequence, the substrate pallet 21 is moved from the process chamber 11b onto the caterpillars 31b in the transport chamber 14. All of the driving gears 39b and 39c, the drive mechanisms 71b and 71c of the lift mechanisms 36b and 36c in the transport chamber 14, and drive mechanisms (not shown) of the pallet support mechanisms 25b and 25c in the process chambers 11b and 11c are driven at the timings described above as commanded by the controller 41.

The separation valves 18a, 18b, and 18c are opened only when the substrate pallet 21 is moved between the transport chamber 14 and the process chambers 11a, 11b, and 11c. The separation valve 18d is opened only when the substrate pallet 21 is transported from the inlet chamber 12 to the transport chamber 14. The separation valve 18e is opened only when the substrate pallet 21 is transported from the transport chamber 14 to the outlet chamber 13. The separation valves 18a, 18b, 18c, 18d, and 18e are opened and closed under the control of the controller 41.

Next, the operation of the inline film forming system according to an the embodiment will be described by taking the producing of a multilayer film comprising three magnetic materials A, B, and C laminated in order of A, B, C, and B on a substrate as an example. First, a target 23a made of material A is located in the process chamber 11a, a target made of material B is located in the process chamber 11b, and a target made of material C is located in the process chamber 11c. The operation of the sections of the inline film forming system according to the embodiment is controlled by the controller 41.

The user first places a substrate 24 on the substrate pallet 21 at the exterior of the system. Since the permanent magnets 28a and 28b are mounted on the substrate pallet 21 as described above, a magnetic field is applied to the substrate placed on the pallet 21. Next, the user opens the door 17a of the inlet chamber 12, places the substrate pallet 21 on which the substrate 24 is placed on the transport mechanism 15d in the inlet chamber, and then closes the door. The controller 41 evacuates the inlet chamber 12 by the evacuation installation 19e. It also evacuates the transport chamber 14 and the process chambers 11a, 11b, and 11c by the evacuation installations 19d, 19a, 19b, and 19c respectively. After evacuation, the separation valve 18d is opened and the transport mechanism 15d in the inlet chamber and the x direction transport mechanism 15a are driven in the forward direction to carry the substrate pallet 21 to the front of the film forming process chamber 11a (the front of the y direction transport mechanism 16a). Next, the substrate pallet 21 is carried by the y direction transport mechanism 16a into the film forming process chamber 11a already evacuated, is placed on the substrate pallet support mechanism 25a, and then the separation valve 18a is closed.

Once the substrate pallet 21 is carried into the process chamber 11a, a voltage is applied from the RF power supply 22a to the target 23a for starting sputtering. Sputter particles of material A collide against the face of the substrate 24 on the side of the target 23a where a film of material A is formed. At the time, magnetic field 6 is applied to the substrate 24 by the permanent magnets 28a and 28b fixed on the substrate pallet 21 for aligning the magnetic directions of the sputter particles to form a magnetically oriented film.

After the film forming is complete, the separation valve 18a is opened and the y direction transport mechanism 16a is driven to move the substrate pallet 21 into the transport chamber 14 and pass it to the x direction transport mechanism 15a. Next, the x direction transport mechanisms 15a and 15b are driven at the same time in the forward direction to carry the substrate pallet 21 to the front of the film forming process chamber 11b (the front of the y direction transport mechanism 16b).

Meanwhile, magnetic field 6 is applied to the substrate 24 from the permanent magnets 28a and 28b, thus even if the substrate pallet is taken out from the process chamber 11a before the film of material A is completely cooled, film orientation is not disordered. The operation is repeated to form a film of material B on the film of material A in the process chamber 11b.

Successively, the operation is repeated to further form a film of material C on the film of material B in the process chamber 11c.

Upon completion of the film forming in the process chamber 11c, the x direction transport mechanisms 15c and 15b are driven at the same time in the reverse direction again to transport the substrate pallet 21 to the front of the process chamber 11b. Again, a film forming step is performed in the process chamber 11b to form a film of material B on the film of material C. After the step has been executed, the x direction transport mechanisms 15b and 15c are driven in the forward direction to transport the substrate pallet 21. When the substrate pallet 21 arrives in front of the separation valve 18e, the separation valve 18e is opened and the x direction transport mechanism 15c and the outlet chamber transport mechanism 15e are driven at the same time in the forward direction to move the substrate pallet 21 to the outlet chamber 13, and then the separation valve 18e is closed. At this time, the outlet chamber 13 must have been evacuated. After the outlet chamber 13 is restored to atmospheric pressure, the user opens the door 17b in the outlet chamber 13 and removes the substrate pallet 21 on which the substrate 24 is placed to the exterior of the outlet chamber 13.

Since the permanent magnets 28a and 28b are mounted on the substrate pallet 21 used in the embodiment, the magnetic field 6 is always applied to the substrate 24 in the constant direction. Therefore, even while the substrate pallet is transported in the transport chamber 14, the magnetic field 6 is always applied to the substrate 24. If a film is formed by sputtering, the substrate 24 is heated. Formerly, a substrate was placed out of the magnetic field during transportation before it was completely cooled, thus the substrate was sometimes cooled outside the magnetic field, causing orientation of the magnetic film to vary. In the inline film forming system according to this embodiment, a magnetic field is also applied during the transportation, thus there is no risk that the orientation of the formed magnetic film will by disordered.

Since the inline film forming system in this embodiment applies a magnetic field to the substrate 24 by the permanent magnets 28a and 28b of the substrate pallet 21 at all times, the direction of magnetic field applied to the substrate 24 is always constant. This eliminates the need for a cumbersome step of finely adjusting the directions of the magnetic fields of the magnetic field generation means disposed in the process chambers for a complete match, and also eliminates the inconvenience of degrading the magnetic characteristic of the magnetic film caused by a change in the magnetic field direction during the course of film forming. Further, since the permanent magnets 28a and 28b are mounted on the same substrate pallet 21 as the substrate 24, a magnetic field can be applied at close range. Small magnetic field generation means having small magnetic field strength, such as permanent magnets, would be able to apply a magnetic field efficiently, implementing a small inline film forming system. Since the magnetic field generation means is taken out from the system together with the substrate pallet, the magnetic field direction can also be adjusted easily.

Further, in the inline film forming system according to the embodiment, no transport mechanisms are disposed in the process chambers 11a, 1b, 11c, which are separated from the transport chamber 14 by the separation valves 18a, 18b, and 18c respectively, but transport mechanism are located in the transport chamber 14. Therefore, sputter particles in the process chambers do not adhere to the x direction transport mechanisms 15a, 15b, 15c, or the y direction transport mechanisms 16a, 16b, 16c, and there is no risk of inconvenience such that adherence of sputter particles to the drive parts of the transfer mechanisms make it difficult to move the drive parts. This eliminates the need for periodic maintenance to prevent adherence and enables continuous running over a long period of time.

In the inline film forming system according to this embodiment, the x direction transport system is divided into x direction transport mechanisms 15a, 15b, and 15c which correspond to the process chambers 11a, 11b, and 11c respectively and can be driven independently of each other to transport the substrate pallet 21 in different directions. Thus, when a number of substrate pallets 21 are being carried in the system at a time, some substrate pallets 21 can be transported in the forward direction while a different substrate pallet 21 is transported in the reverse direction by another transport mechanism. Therefore, to laminate two films of the same material B put with another film between, for example, for forming a multilayer film, some substrate pallets 21 can be driven in the forward direction for forming a film of a different material A while a different substrate pallet 21 is returned in the reverse direction for again forming a film of material B. Therefore, a multilayer film can be formed efficiently by using a small number of process chambers.

Further, since x direction transport mechanisms 15a, 15b, and 15c are independent of each other corresponding to the process chambers, when the film forming system is delivered to the user, the transport system can be divided for transportation. Formerly, the transport system was unable to be divided for transportation and the maximum line length was limited by the length of transportation facilities. Since the transport system in this embodiment can be divided for transportation, an inline film forming system having a sufficiently long line required for the user can be provided without being limited by the length of transportation facilities.

Although permanent magnets are used as the magnetic field generation means in the embodiment, magnetic coils can also be used in place of the permanent magnets. Further, the inline film forming system can also incorporate drive means for changing the direction of a permanent magnet on the substrate pallet to the direction as commanded. The drive means would enable production of a multilayer film by applying a magnetic field to each layer in any desired different direction. Although every process chamber is provided with film forming means in the embodiment, process chambers for heating, etching, milling, etc., can also be installed as a matter of course.

Figure 5:
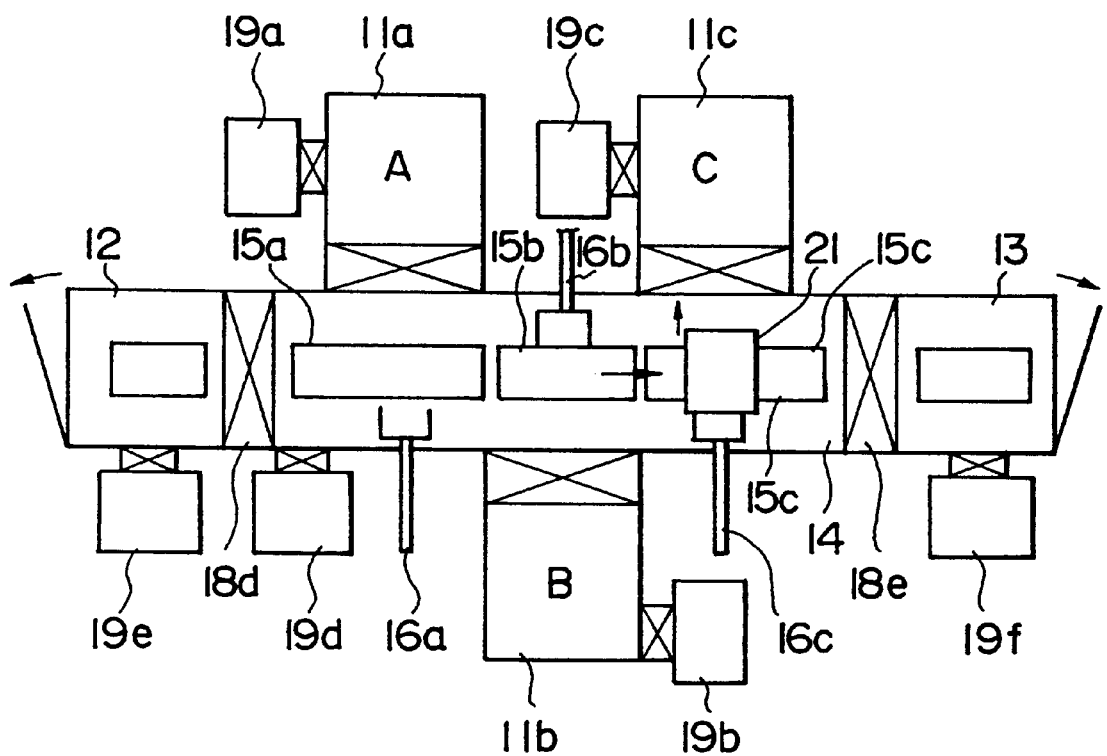
FIG. 5 is a block diagram showing another arrangement of the inline film forming system according to the embodiment of the invention.

The process chambers 11a, 11b, and 11c can also be installed on both sides of the transport chamber 14, as shown in FIG. 5, thereby remarkably shortening the overall length of the transport line.

Figure 6:
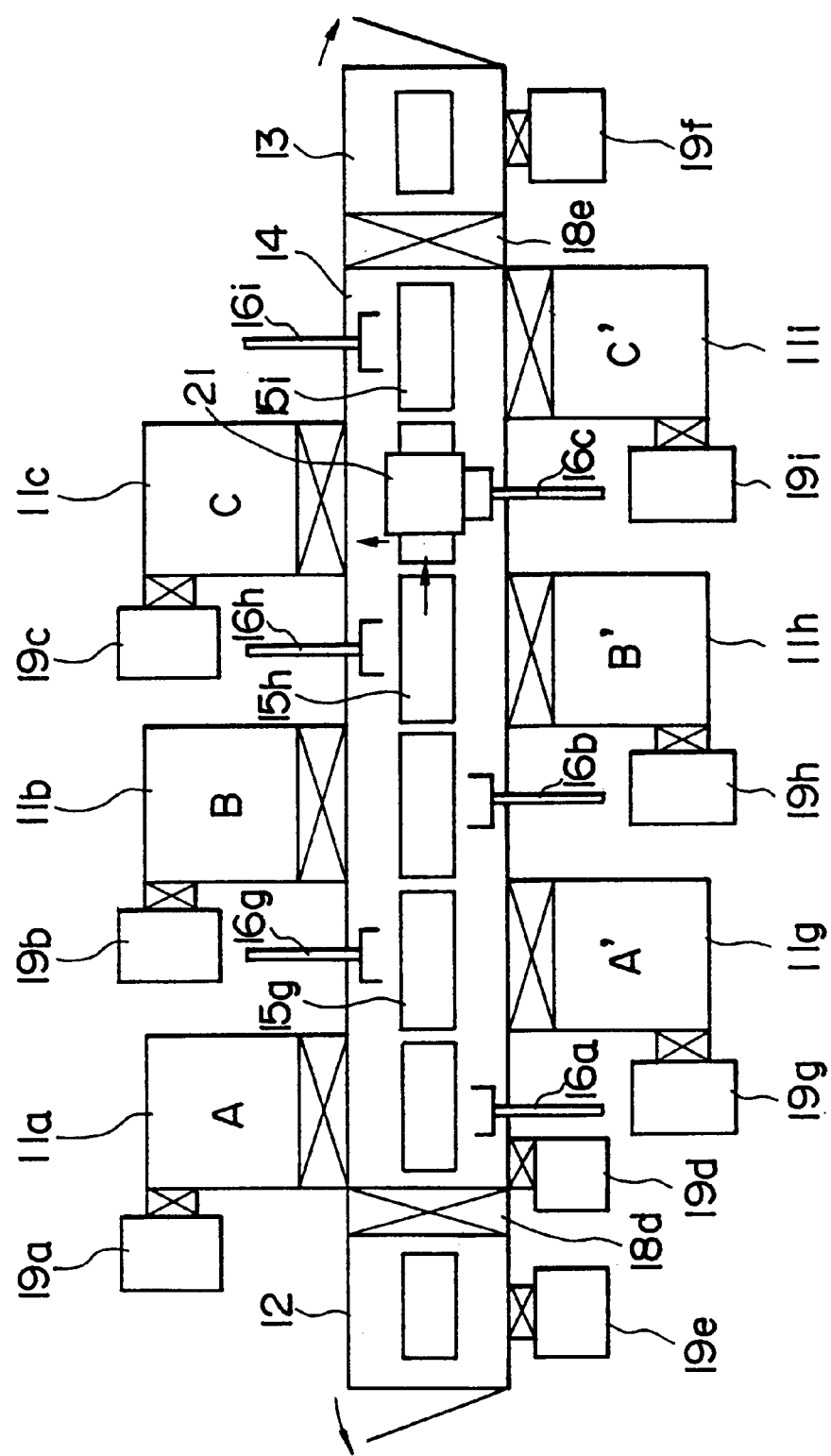
FIG. 6 is a block diagram showing a further arrangement of the inline film forming system according to the embodiment of the invention.
Figure 7:
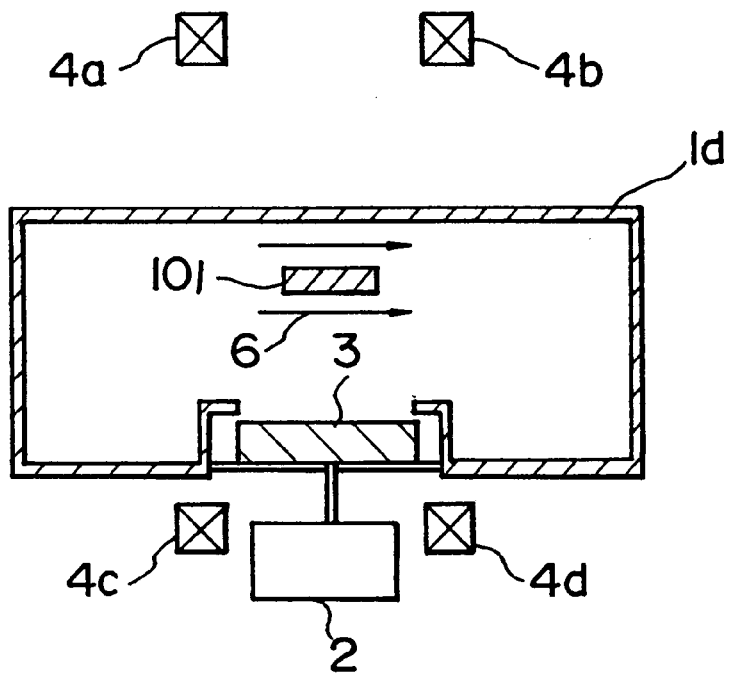
FIG. 7 is a sectional view showing the configuration of a conventional film forming system for forming a film in a magnetic field.
Figure 8:
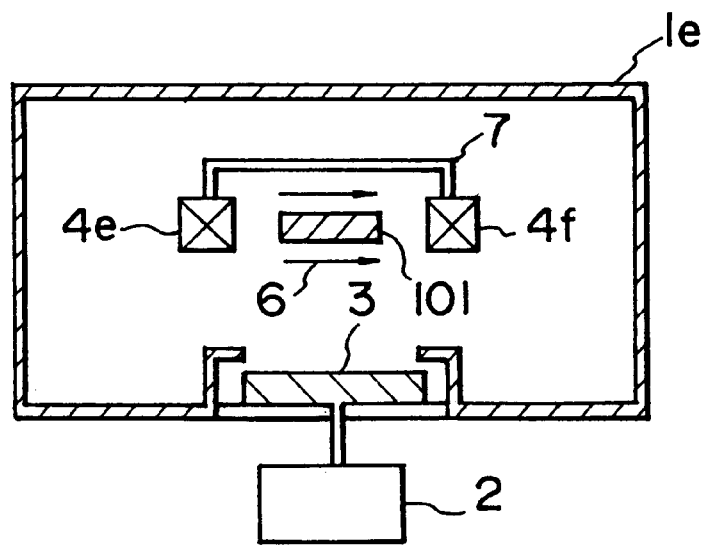
FIG. 8 is a sectional view showing the configuration of a conventional film forming system for forming a film in a magnetic field.
Figure 9:
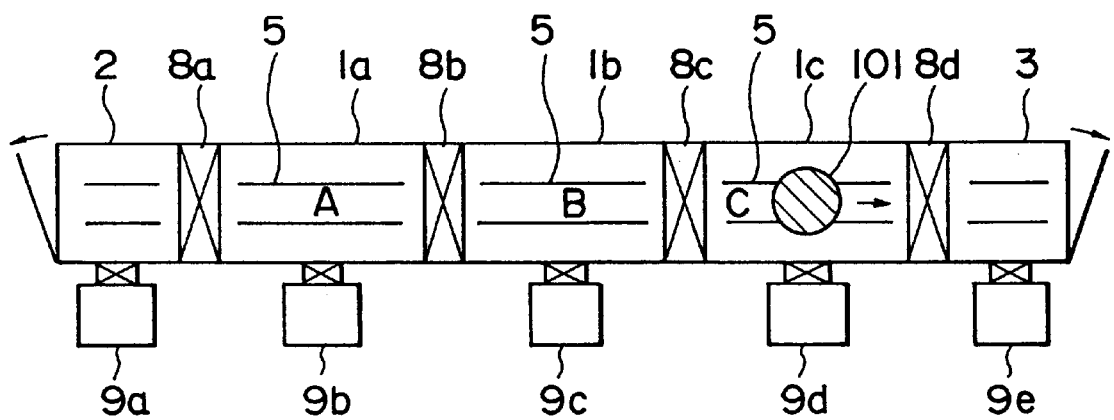
FIG. 9 is a block diagram showing the overall configuration of a conventional inline film forming system.

FIG. 6 shows an example of the inline film forming system further including three process chambers 11g, 11h, and 11i as spare chambers. The process chamber 11g includes a target of the same material A as the process chamber 11a; the process chamber 11h includes a target of the same material B as the process chamber 11b; and the process chamber 11i includes a target of the same material C as the process chamber 11c. The transport chamber 14 is provided with x direction transport mechanisms 15g, 15h, and 15i and y direction transport mechanisms 16g, 16h, and 16i for the process chambers 11g, 11h, and 11i. At the beginning, a multilayer film is formed in the process chambers 11a, 11b, and 11c. If the target in the process chamber 11a is exhausted, the process in the process chamber 11a is switched to the process chamber 11g to continue forming the multilayer film in the process chambers 11g, 11b, and 11c. While it is being formed in the process chambers 11g, 11b, and 11c, the target in the process chamber 11a is replaced with a new one. Next, when it becomes necessary to clean the process chamber 11b, the process in the process chamber 11b is switched to the process chamber 11h to continue forming the multilayer film in the process chambers 11g, 11h, and 11c. Meanwhile, the target in the process chamber 11b is replaced with a new one. Thus, the spare chambers with which the process chambers are provided enable continuous running of the system even if inconvenience occurs or maintenance is required in the process chamber.

Since the process chambers 11a, 11b, and 11c are separated from the transport chamber 14 by the separation valves 18a, 18b, and 18c respectively, foreign materials such as sputter particles do not adhere in the transport chamber 14. Therefore, necessity for maintenance and inspection in the transport chamber 14 is remarkably reduced and further the system can be continuously run over a long period of time.

Next, the form of the permanent magnets on the substrate pallet 21 in the embodiment will be discussed in more detail.

Figure 10:
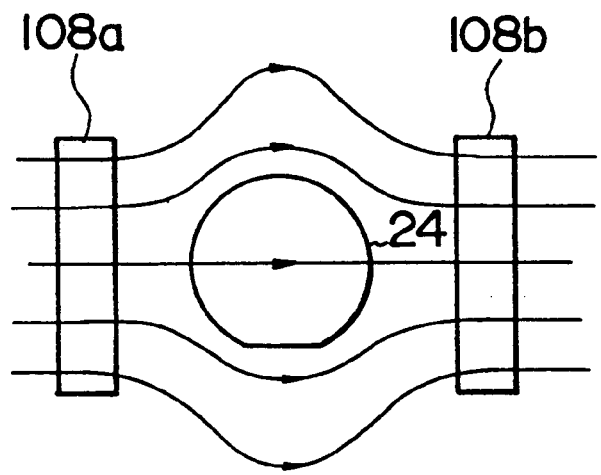
FIG. 10 is an illustration showing magnetic lines of force of a magnetic field when permanent magnets which have a short bar form are used with the substrate pallet in FIG. 2(A)

On the substrate pallet 21 shown in FIG. 2, two permanent bar magnets 28a and 28b are disposed parallel and facing each other, with the substrate 24 between them so that a uniform magnetic field 6 is applied to the substrate 24. At this time, whether or not magnetic lines of force of magnetic field 6 in the portion of the substrate 24 are completely parallel is determined by the length of the permanent magnet 28a, 28b FIG. 10 shows magnetic lines of force when permanent bar magnets 108a and 108b each having the length comparable to the diameter of the substrate 24 are used, for example, as the permanent magnets 28a and 28b. Since the magnetic lines of force at both ends of the magnet 108a, 108b have a nature of bending outwardly, the center of the substrate 24 and the portions near both ends of the magnet 108a, 108b differ in direction of magnetic lines of force, as shown in FIG. 10, and magnetic field distribution of small skew angle is not obtained. The skew angle refers to the horizontal angle difference between the desired and actual magnetic field directions. Since the peripheral portion and center of the substrate 24 differ in direction of an applied magnetic field, the film formed on the substrate 24 varies in direction of magnetization.

Figure 11:
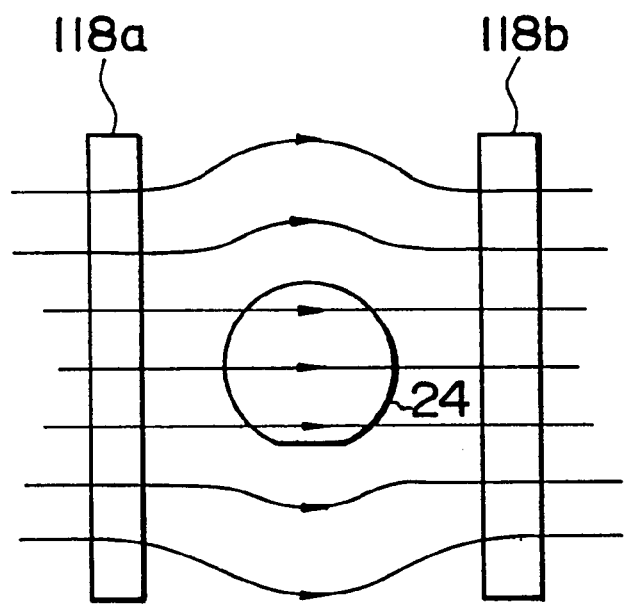
FIG. 11 is an illustration showing magnetic lines of force of a magnetic field when permanent magnets which have a long bar form are used with the substrate pallet in FIG. 2(A)

FIG. 11 shows magnetic lines of force when permanent bar magnets 118a and 118b each having a length which is about twice the diameter of the substrate 24 are used. In the example, the substrate 24 is placed apart from both ends of the permanent bar magnets 118a, 118b. Thus, even if the magnetic lines of force on both ends of the permanent magnets 118a, 118b bend outwardly, completely parallel magnetic lines of force from the center of the permanent magnet 118a, 118b are distributed across the substrate 24 and a magnetic field having magnetic lines of force aligned in direction can be applied to the substrate 24.

Therefore, the length of the permanent magnets 28a, 28b of the substrate pallet 21 in FIG. 2 may be determined according to the orientation characteristic of magnetization direction of a film required. For example, if the orientation of a film formed on a substrate 24 must be completely uniform on the substrate 24, long permanent magnets 118a and 118b as shown in FIG. 11 are used to apply completely parallel magnetic lines of force to the substrate 24. For example, if the orientation of a film formed on a substrate 24 may slightly vary, short permanent magnets 108a and 108b as shown in FIG. 10 can be used as the permanent magnets 28a and 28b. If the short permanent magnets 108a and 108b can be used, the size of the substrate pallet 21 can be made small, providing the advantage of enabling the size of the inline film forming system according to the embodiment to be made small.

If permanent magnets formed as described below are used, short permanent magnets would be able to apply completely parallel magnetic lines of force to a substrate 24, thus the substrate pallet 21 and the inline film forming system can be made small in size, as described in more detail below with reference to FIG. 12.

Figure 12:
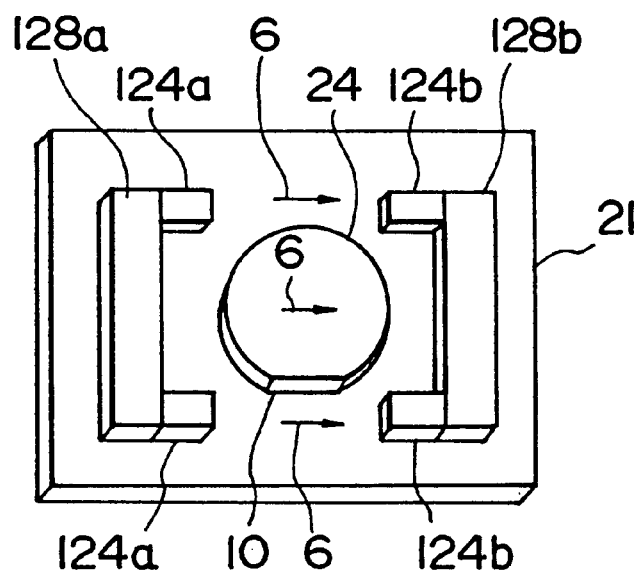
FIG. 12 is a perspective view showing another example of substrate pallet that can be used with the inline film forming system according to the embodiment shown in FIG. 3.

As shown in FIG. 12, two permanent bar magnets 128a and 128b are disposed in parallel on a pallet 21. Auxiliary magnets 124a and 124b made of the same material as the permanent magnets 128a and 128b are fixed to the sides at both ends of the permanent magnets 128a and 128b facing a substrate 24. The forms of the substrate 24 and substrate pallet 21 are the same as shown in FIG. 2, and will therefore not be discussed again.

Figure 13:
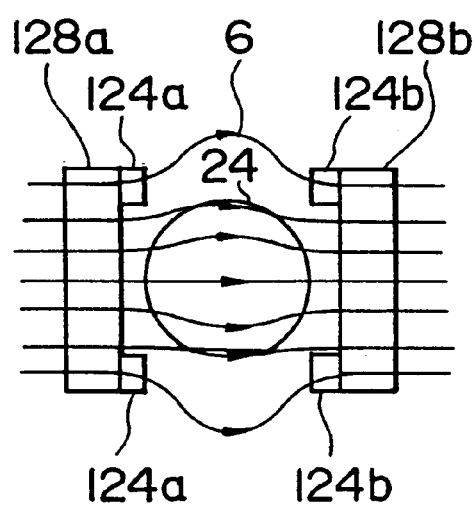
FIG. 13 is an illustration showing magnetic lines of force of a magnetic field applied to the substrate mounted on the substrate pallet in FIG. 12.

Next, FIG. 13 shows directions of magnetic lines of force applied to the substrate 24 by the permanent magnets 128a, 128b and the auxiliary magnets 124a, 124b shown in FIG. 12. The auxiliary magnets 124a and 124b enhance the strength of the magnetic field applied to the substrate 24 from both ends of the permanent magnet 128a, 128b. For this reason, outward swelling of magnetic lines of force of magnetic field 6 at both ends of the permanent magnet 128a, 128b lessens, and even magnets 128a, 128b each having the length comparable to the diameter of the substrate 24 can apply a magnetic field to the entire substrate 24 in a uniform direction. Thus, if auxiliary magnets 124a and 124b are installed, the permanent magnet 128a, 128b, which has a the length comparable to the diameter of the substrate 24, can apply a magnetic field aligned in direction to the whole substrate 24 when a magnetic film is formed. As a result, the size of the substrate pallet 21 can be made small.

Figure 15:
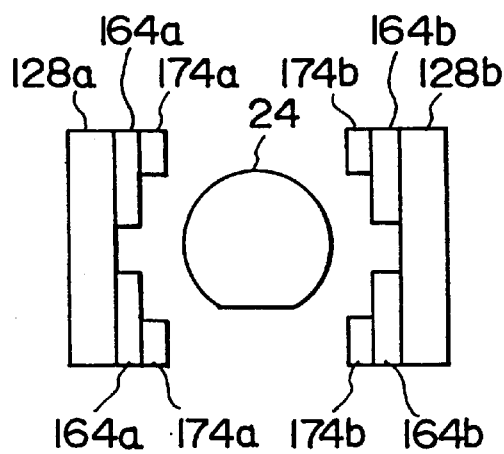
FIG. 15(A) is a top view showing the forms of permanent magnets mounted on a substrate pallet that can be used with the inline film forming system according to the embodiment shown in FIG. 3.
FIG. 15(B) is a top view showing the forms of permanent magnets mounted on a substrate pallet that can be used with the inline film forming system according to the embodiment shown in FIG. 3.
Figure 15:
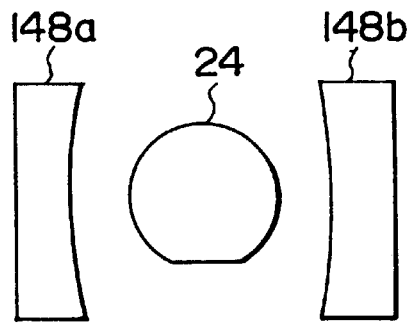

FIGS. 15(A) and 15(B) show the forms of other permanent magnets. In FIG. 15(A), auxiliary magnets 164a and 164b are disposed on sides at both ends of permanent magnets 128a and 128b facing a substrate 24 and further auxiliary magnets 174a and 174b are disposed on sides of auxiliary magnets 164a and 164b facing the substrate 24. In FIG. 15(B), the faces of permanent magnets 148a and 148b facing the substrate 24 are each processed like a circular arc without auxiliary magnets, thereby making both ends of the permanent magnets 148a and 148b thicker than the centers thereof. In FIGS. 15(A) and 15(B), the magnetic flux density at both ends of each of the permanent magnets 128a and 128b and 148a and 148b increases gradually towards both the ends, thus disorder of magnetic lines of force applied to the substrate 24 can be lessened.

Figure 14:
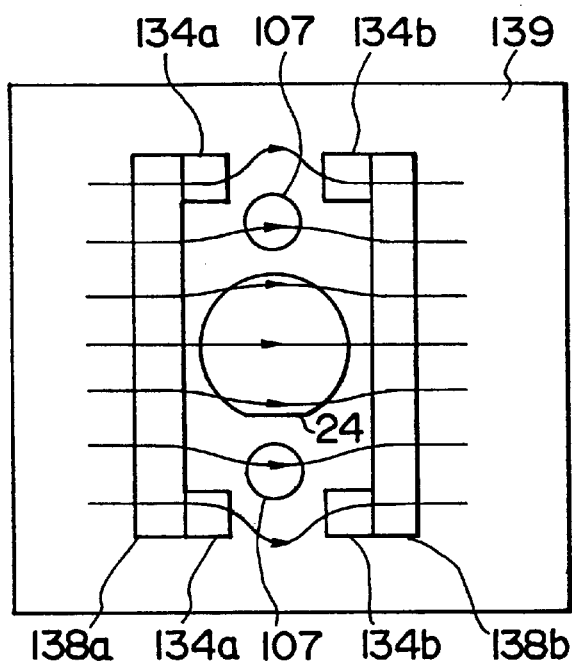
FIG. 14 is a top view showing another example of substrate pallet that can be used with the inline film forming system according to the embodiment shown in FIG. 3.

FIG. 14 shows another example of a substrate pallet on which permanent magnets provided with auxiliary magnets are mounted. On the substrate pallet 139 shown in FIG. 14, two auxiliary substrates 107 are placed each on either side of a substrate 24. The substrate 24 and the auxiliary substrates 107 are retained by a through hole whose edges are stepped, disposed on the substrate pallet 139. The auxiliary substrates 107 are located to monitor the nature of a film formed on the substrate 24 by using films formed on the auxiliary substrates 107. Therefore, a magnetic field must also be applied to the auxiliary substrates 107 under the same conditions as the substrate 24.

To attempt to apply a magnetic field whose magnetic lines of force are parallel to the auxiliary substrates 107 and the substrate 24 by using only permanent bar magnets 138a and 138b on the substrate pallet where the auxiliary substrates 107 are placed each on either side of the substrate 24, permanent magnets 138a and 138b in the form of very long bars must be used to position both the ends thereof sufficiently outside the auxiliary substrates 107. In the example in FIG. 14, both the ends of the permanent bar magnets 138a and 138b are positioned just outside the auxiliary substrates 107, but auxiliary magnets 134a and 134b cause the strength of magnetic field at both ends of the permanent magnets 138a and 138b to be enhanced, lessening outward swelling of magnetic lines of force at both ends. Thus, a uniform magnetic field can also be applied to the entire auxiliary substrates 107 in the same direction as the substrate 24.

At the substrate pallets shown in FIGS. 12, 14, and 15(A), the directions and density of magnetic lines of force of magnetic field applied to the substrate 24, etc., are determined by the balance of the size of magnetization of the permanent magnets 128a, 128b, 138a, 138b and that of the auxiliary magnets 124a, 124b, 134a, 134b, 164a, 164b, 174a, 174b (that is, magnetic flux density of the magnetic field generated). The size and forms of auxiliary magnets required to provide a uniform magnetic field are determined as discussed below.

As an example, the sequence of finding the size of auxiliary magnets 134a and 134b on the substrate pallet 139 in FIG. 14 will be described with reference to FIGS. 16 to 18. First, auxiliary magnets 144a, 144b, 154a, 154b, 134a, and 134b of proper size were located at both ends of permanent magnets 138a and 138b and magnetic lines of force of magnetic field generated were calculated by a large-scale computer with a magnetic field analysis simulation program. Magnetic field analysis simulation was executed under calculation conditions of two dimensions, axis symmetry with remaining magnetization size, forms, and arrangement of the permanent magnets 138a and 138b and auxiliary magnets 144a, etc., as parameters. A generally known program was used for the magnetic field analysis simulation program. The auxiliary magnets 144a, 144b, 154a, 154b, 134a, and 134b were made of the same material as the permanent magnets 138a and 138b.

Figure 16:
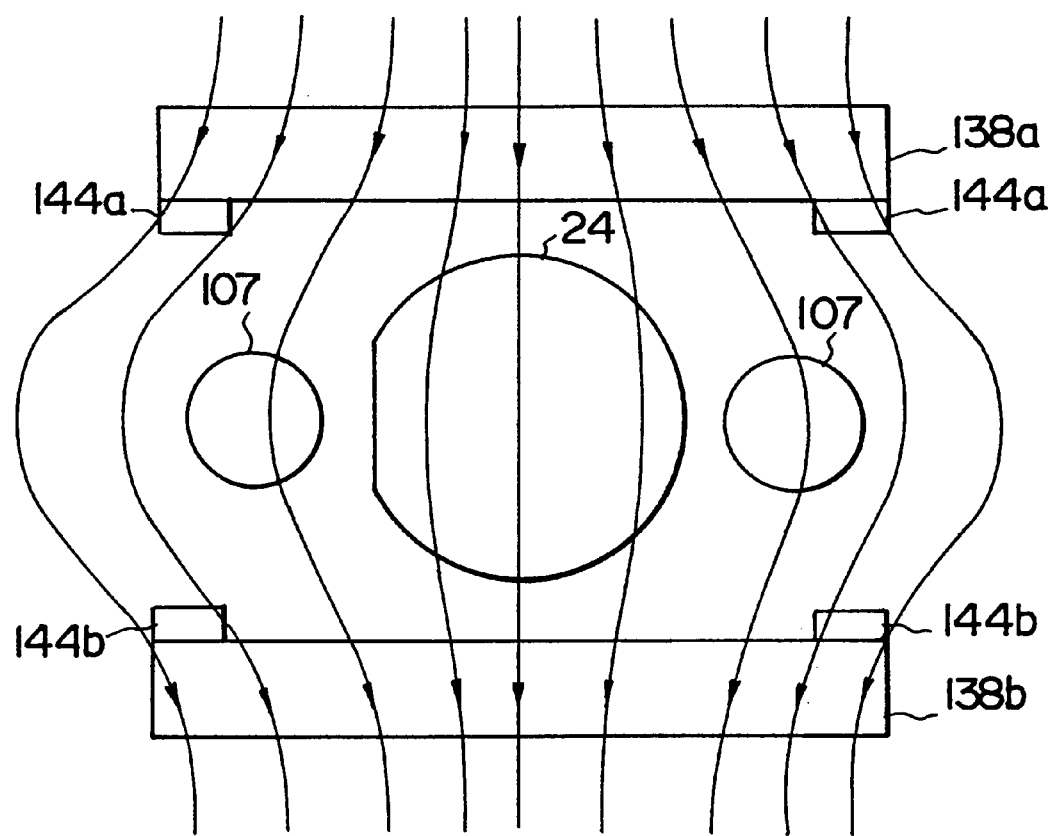
FIG. 16 is an illustration showing magnetic lines of force of magnetic field when too small auxiliary magnets are used on 10 the substrate pallet shown in FIG. 14.
Figure 17:
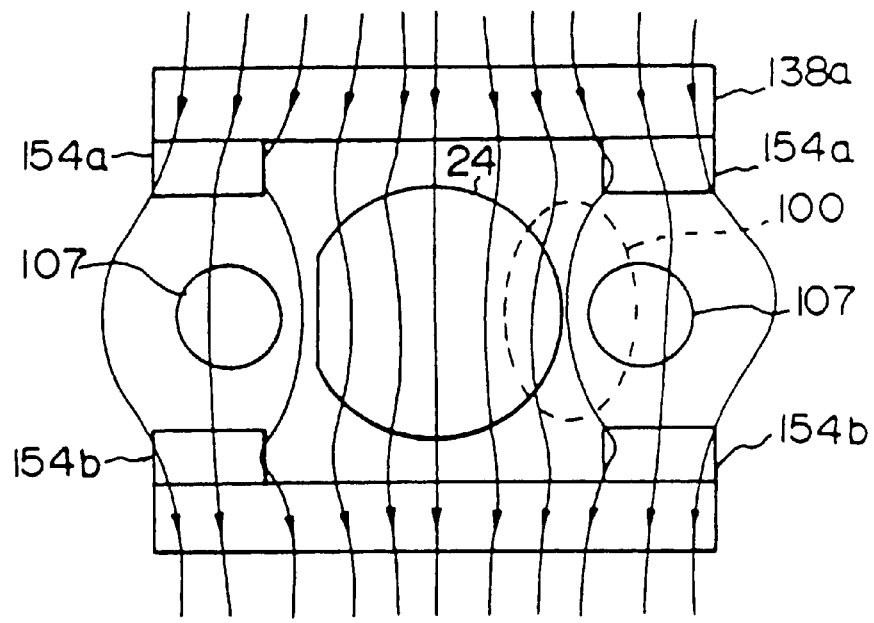
FIG. 17 is an illustration showing magnetic lines of force of magnetic field when too large auxiliary magnets are used on the substrate pallet shown in FIG. 14.
Figure 18:
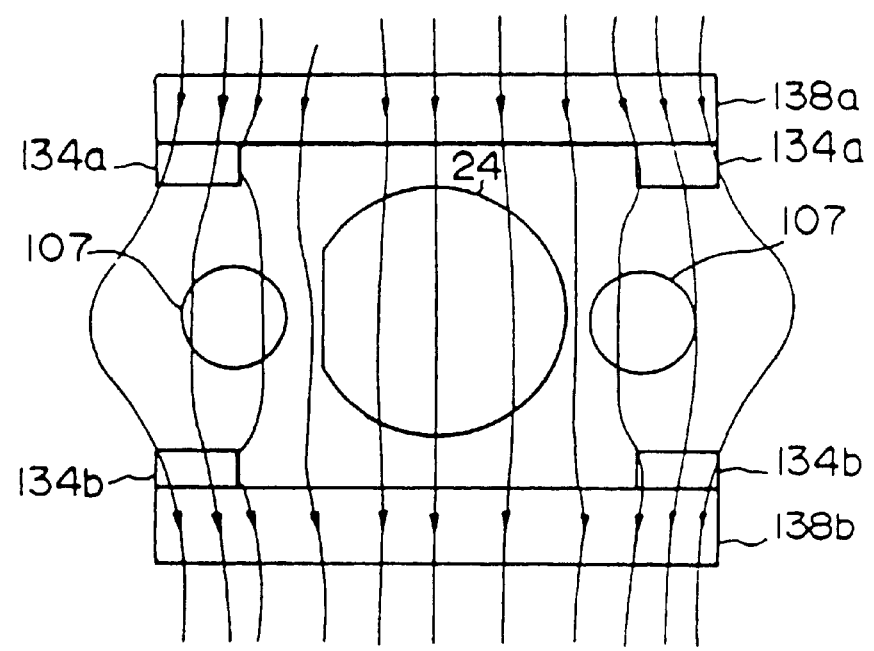
FIG. 18 is an illustration showing magnetic lines of force of magnetic field when auxiliary magnets of proper size are used on the substrate pallet shown in FIG. 14.

The calculation results are shown in FIGS. 16 to 18. As shown in FIG. 16, when the auxiliary magnets 144a and 144b were used, they were so small that the generated magnetic field was weak and it was not possible to suppress the swelling of the magnetic lines of force at both ends of the permanent magnets 138a and 138b. Thus, the magnetic lines of force of the magnetic field applied to auxiliary substrates 107 became outwardly swelled curves, and it was not possible to match the direction of the magnetic lines of force of the magnetic field applied to the auxiliary substrates 107 with that of the magnetic field applied to the substrate 24.

On the other hand, as shown in FIG. 17, when the auxiliary magnets 154a and 154b were used, they were so large that the generated magnetic field was too strong and the magnetic lines of force of the magnetic field of the auxiliary magnets 154a, 154b became swollen curves toward the substrate 24 in a region 100 between the substrate 24 and the auxiliary substrate 107, and it was not possible to make the direction of the magnetic lines of force of the magnetic field applied to the auxiliary substrates 107 match that of the magnetic field applied to the substrate 24. It was also found that the magnetic flux density of the magnetic field applied to the auxiliary substrates 107 differs from that of the magnetic field applied to the substrate 24.

As shown in FIG. 18, when the auxiliary magnets 134a and 134b were used, they were proper in size, thus magnetic lines of force of the magnetic field applied to the substrate 24 and auxiliary substrates 107 were parallel and spaced at given intervals and equal to each other in magnetic flux density and direction. Therefore, the auxiliary magnets 134a and 134b were mounted on the substrate pallet 139, as shown in FIG. 14.

Thus, to produce auxiliary magnets, a magnetic field is previously simulated as described above to determine the size and arrangement of auxiliary magnets so that magnetic lines of force become parallel on the substrate 24 and auxiliary substrates 107 and are spaced at given intervals. Then, permanent magnets are processed.

As shown in FIG. 15(B), to determine the forms of permanent magnets 148a and 148b, a magnetic field is also first simulated as described above to find the forms of the permanent magnets 148a and 148b for providing a uniform magnetic field.

Thus, in the inline film forming system according to this embodiment, a small substrate pallet with short permanent magnets can be used by making the magnetic flux density of a magnetic field generated at both ends of the permanent magnet on the substrate pallet larger than that at the center thereof. In addition, since only small auxiliary magnets need to be mounted, a small amount of magnetic material is required to make light and economical magnets. Such a small and light substrate pallet is easily transported and is appropriate for use with an inline film forming system. Also, process and transport chambers of an inline film forming system can be small-sized. Further, if small permanent magnets are used, the system is unlikely to be affected by a magnetic field of a sputter target in a magnetron sputter process chamber.

Although the auxiliary magnets are made of the same material as the permanent magnets in this embodiment, they can also be made of different materials as a matter of course. If auxiliary magnets are made of a material with larger magnetization than permanent magnets, a uniform magnetic field can be provided by smaller auxiliary magnets.

Further, permanent magnets are used as means for applying a magnetic field to the substrate 24 in this embodiment, but coils can also be used, in which case magnetic lines of force can be spaced at constant intervals and match in direction as in the embodiment by increasing the number of windings of coils disposed at both ends of a substrate and enhancing an electric current. In this case, simulation of magnetic lines of force is also executed to determine the strength of magnetic field at both ends.

Figure 19:
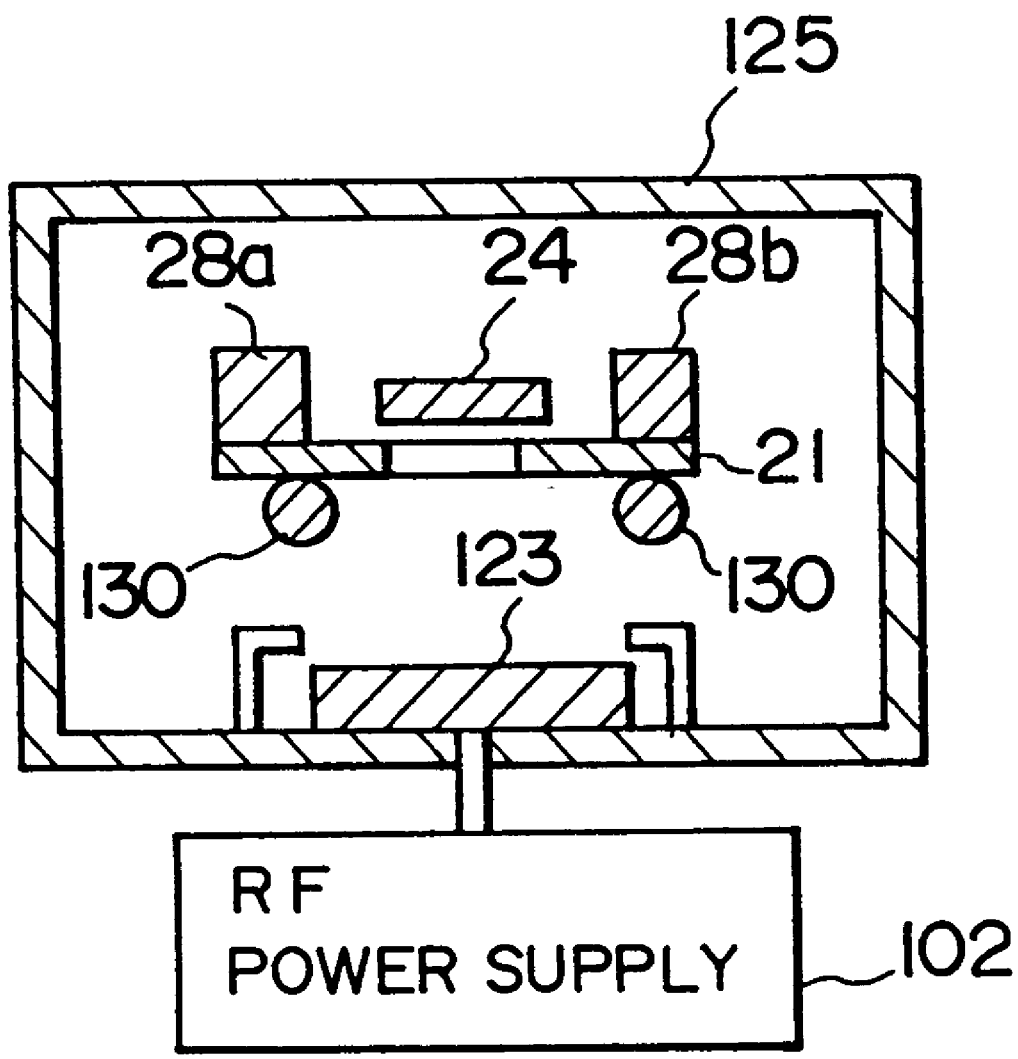
FIG. 19 is a sectional view showing the arrangement of a film forming system according to another embodiment of the invention.

Although the inline film forming system is discussed in this embodiment, the invention is not limited to this embodiment. For example, a support mechanism 130 for supporting a substrate pallet can also be fixed for placing a substrate pallet 21 in a vacuum container 125 of only one chamber as shown in FIG. 19. The vacuum container 125 is provided with a power supply 102 and a sputter target 123 as film forming means. Permanent magnets 28a and 28b are installed on the substrate pallet 21. Auxiliary magnets can also be installed on the substrate pallet. In such a vacuum system, if the substrate pallet 21, etc., is used, a substrate 24 together with the substrate pallet 21 can be taken out. Therefore, even if it is taken out from the vacuum container 125 before a film on the substrate 24 is completely cooled, film orientation is not disordered because applying a magnetic field from the permanent magnets 28a, 28b continues. Since the substrate pallet can be taken out immediatly after a film is formed, the throughput of the vacuum container 125 can be raised.

Regardless of where a substrate is placed in the system, the magnetic film forming system can always apply a magnetic field to the substrate in a constant direction so long as the substrate is mounted on the substrate pallet, thus the system can manufacture magnetic films having excellent magnetic characteristics.

What is claimed is:

1. A magnetic film forming system comprising:
   a vacuum container;
   a substrate pallet for holding a substrate in said vacuum container, said substrate pallet being removable from said vacuum container while still holding said substrate;
   means for supporting said substrate pallet in said vacuum container;

means for forming a film on said substrate; and magnetic field generation means for applying a magnetic field to said substrate;

said magnetic field generation means being fixed to said substrate pallet such that it is removed from said vacuum container along with said substrate pallet, when said substrate pallet is removed from said vacuum container; and said substrate being provided with a means which prevents the rotation of said substrate on said substrate pallet in order to maintain a predetermined direction of said substrate relative to the magnetic field applied by said magnetic field generation means.

2. A magnetic film forming system comprising:

a vacuum container;

a substrate pallet for holding a substrate;

transport means for supporting said substrate pallet in said vacuum container and transporting said substrate pallet;

means for forming a film on said substrate; and magnetic field generation means for applying a magnetic field to said substrate;

said magnetic field generation means being fixed to said substrate pallet such that it is transported along with said substrate pallet, when said substrate pallet is transported by said transport means; and said substrate being provided with a means which prevents the rotation of said substrate on said substrate pallet in order to maintain a predetermined direction of said substrate relative to the magnetic field applied by said magnetic field generation means.

3. A magnetic film forming system as claimed in claim 2 wherein said magnetic field generation means is a permanent magnet.

4. A magnetic film forming system as claimed in claim 2 wherein said magnetic field generation means is a pair of permanent magnets disposed facing each other with a space for holding said substrate therebetween and a magnetic flux density of a magnetic field formed at both ends of said permanent magnet is larger than that of a magnetic field formed at a center of said permanent magnet.

5. A magnetic film forming system as claimed in claim 2, wherein said vacuum container has a process chamber for forming a film on said substrate and a transport chamber linked to said process chamber and said transport means is disposed in said transport chamber and has means for carrying in a substrate pallet from said process chamber into said transport chamber and means for carrying out said substrate pallet from said transport chamber into said process chamber.

6. A magnetic film forming system as claimed in claim 5 wherein a plurality of said process chambers are contained, said means for carrying in and said means for carrying out being disposed corresponding to each of said plurality of process chambers, and said transport means further includes means for moving said substrate pallet from the said means for carrying in and said means for carrying out corresponding to one process chamber to those corresponding to another.

7. A magnetic film forming system as claimed in claim 6 wherein said means for moving is separated into a plurality of portions corresponding to said plurality of process chambers on a one-to-one basis and said plurality of portions can be driven independently of each other in both forward and reverse directions.

8. An inline film forming system comprising:

a transport chamber comprising transport means;

a plurality of process chambers being disposed along length of said transport chamber and linked thereto;

film forming means disposed in said plurality of process chambers;

a substrate pallet for holding a substrate and being transported by said transport means while holding said substrate;

magnetic field generation means being fixed to said substrate pallet and for applying a magnetic field to said substrate;

said magnetic field generation means being transported by said transport means together with said substrate pallet; and said substrate being provided with a means which prevents the rotation of said substrate on said substrate pallet in order to maintain a predetermined direction of said substrate relative to the magnetic field applied by said magnetic field generation means.

9. An inline film forming system as claimed in claim 8 wherein said transport means has means for carrying in said substrate pallet from said transport chamber into said process chamber, means for carrying out said substrate pallet from said process chamber into said transport chamber, and means for moving said substrate pallet along a length of said transport chamber;

said means for carrying in and said means for carrying out being disposed for each of said plurality of process chambers;

said means for moving being separated into a plurality of portions corresponding to said plurality of process chambers on a one-to-one basis; and said plurality of portions being able to be driven independently of each other in both forward and reverse directions.

10. A magnetic film forming system comprising:

a vacuum container;

a substrate holder for holding a substrate in said vacuum container;

means for forming a film on said substrate; and a pair of magnetic field generation means for applying a magnetic field to said substrate;

said pair of magnetic field generation means being fixed on the substrate holder and facing each other with a space for holding said substrate therebetween; and wherein a magnetic flux density of a magnetic field formed at both ends of said magnetic field generation means is larger than that of a magnetic field formed at a center of said magnetic field generation means.

11. A magnetic film forming system as claimed in claim 10 wherein said magnetic field generation means is a permanent magnet.

12. A magnetic film forming system comprising:

a vacuum container;

a substrate pallet transported through the vacuum container;

a substrate held on the substrate pallet;

magnetic field generation means mounted on the substrate pallet for applying a magnetic field to the substrate; and wherein the magnetic field generation means remains mounted on the substrate pallet when the substrate pallet is withdrawn from the vacuum container so as to maintain alignment of the magnetic field applied to the substrate.

13. A magnetic film forming system according to claim 12 further comprising transport means for transporting said substrate pallet into and out of said vacuum container.

14. A magnetic film forming system according to claim 13 further comprising means for forming a film on the substrate.

15. A magnetic film forming system according to claim 14 further comprising means for preventing rotation of the substrate on the substrate pallet.

* * * * *